(12) United States Patent
Ryan et al.

(10) Patent No.: US 7,557,035 B1
(45) Date of Patent: Jul. 7, 2009

(54) METHOD OF FORMING SEMICONDUCTOR DEVICES BY MICROWAVE CURING OF LOW-K DIELECTRIC FILMS

(75) Inventors: E. Todd Ryan, Wappingers Falls, NY (US); John A. Iacoponi, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 754 days.

(21) Appl. No.: 10/849,847

(22) Filed: May 21, 2004

Related U.S. Application Data

(63) Continuation of application No. 10/817,864, filed on Apr. 6, 2004, now abandoned.

(51) Int. Cl.
*H01L 21/4763* (2006.01)

(52) U.S. Cl. .................. 438/638; 438/633; 438/676; 438/687; 257/E21.579

(58) Field of Classification Search .................. 438/618, 438/633, 634, 636, 637, 638, 676, 687, FOR. 355, 438/FOR. 489; 257/E21.579
See application file for complete search history.

(56) References Cited

U.S. PATENT DOCUMENTS

| | | | |
|---|---|---|---|
| 5,738,915 A | 4/1998 | Fathi et al. | |
| 5,818,111 A | 10/1998 | Jeng et al. | |
| 6,054,769 A | 4/2000 | Jeng | |
| 6,114,186 A | 9/2000 | Jeng et al. | |
| 6,121,130 A | 9/2000 | Chua et al. | |
| 6,169,039 B1 | 1/2001 | Lin et al. | |
| 6,184,121 B1 * | 2/2001 | Buchwalter et al. | 438/622 |
| 6,355,563 B1 | 3/2002 | Cha et al. | |
| 6,436,824 B1 | 8/2002 | Chooi et al. | |
| 6,528,409 B1 | 3/2003 | Lopatin et al. | |
| 6,562,448 B1 | 5/2003 | Chamberlain et al. | |
| 6,583,497 B2 | 6/2003 | Xia et al. | |
| 6,603,204 B2 | 8/2003 | Gates et al. | |
| 6,647,994 B1 | 11/2003 | Lui et al. | |
| 6,656,830 B1 | 12/2003 | Subramanian et al. | |
| 6,890,639 B2 * | 5/2005 | Mandal | 428/312.6 |
| 2002/0081834 A1 | 6/2002 | Daniels et al. | |
| 2003/0040195 A1 | 2/2003 | Chang et al. | |

(Continued)

OTHER PUBLICATIONS

Josh H Golden et al., Designing Porous Low-k Dielectric, May 1, 2001, pp. 1-8, www.microbar.com/news/articles/articles/designLOWkdielectric/porus.hitm.

C.E. Mohler, et al., Silk Semiconductor Dielectric Resin Films, Technical Paper, pp. 1-7, Sep. 2003, Trademark Of Dow Chemical Company.

*Primary Examiner*—Michelle Estrada
(74) *Attorney, Agent, or Firm*—McDermott Will & Emery LLP

(57) ABSTRACT

The invention provides a method of exposing low-k dielectric films to microwave radiation to cure the dielectric films. Microwave curing reduces the cure-time necessary to achieve the desired mechanical properties in the low-k films, thus decreasing the thermal exposure time for the NiSi transistor contacts. A lower thermal budget for interconnect fabrication is necessary to prevent damage to the NiSi transistor contacts and minimize thermal stressing of previously formed interconnect layers. Microwave-cured dielectric films also have higher mechanical strength and strong adhesion to overlying layers deposited during subsequent semiconductor device manufacturing steps.

20 Claims, 6 Drawing Sheets

U.S. PATENT DOCUMENTS

| | | |
|---|---|---|
| 2003/0114013 A1 | 6/2003 | Hendrick et al. |
| 2004/0084774 A1 | 5/2004 | Li et al. |
| 2004/0130032 A1 | 7/2004 | Gronbeck et al. |
| 2004/0152254 A1 | 8/2004 | Vaartstra et al. |
| 2005/0142349 A1 * | 6/2005 | Irwin et al. ............. 428/323 |
| 2005/0260864 A1 * | 11/2005 | Huang et al. ............. 438/792 |

* cited by examiner

METHOD OF FORMING SEMICONDUCTOR DEVICES BY MICROWAVE CURING OF LOW-K DIELECTRIC FILMS

This application is a continuation of application Ser. No. 10/817,864, filed, Apr. 6, 2004 now abandoned.

TECHNICAL FIELD

The present invention relates to a method of manufacturing a semiconductor device exhibiting reduced capacitance loading. The present invention has particular applicability in manufacturing high-density, multi-level semiconductor devices comprising sub-micron dimensions and exhibiting high circuit speed.

BACKGROUND OF THE INVENTION

The escalating requirements for high density and performance associated with ultra large-scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene"-type processing. Generally, this process involves forming a via opening in the inter-metal dielectric layer or inter-layer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical-mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

High performance microprocessor applications require rapid speed of semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems may result from the use of Al. Poor step coverage causes high current density and enhanced electromigration.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization levels. Cu and Cu-based alloy metallization systems have very low resistivities, which are significantly lower than W and even lower than those utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures formed by well-known "wet" plating techniques, such as electroless and electroplating techniques, at deposition rates fully compatible with the requirements of manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. A physical vapor deposition technique, such as sputtering, is useful for depositing the nucleation/speed layer.

Another technique to increase the circuit speed is to reduce the capacitance of the inter-metal dielectrics. The speed of semiconductor circuitry varies inversely with the resistance (R) and capacitance (C) of the interconnection system. The higher the value of the R×C product, the more limiting the circuit speed. As integrated circuits become more complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron.

The dielectric constant of materials conventionally employed in the manufacture of semiconductor devices for an ILD ranges from about 3.9 for dense silicon dioxide to over 8 for deposited silicon nitride. The value of the dielectric constant expressed herein is based upon a value of one for a vacuum. In an effort to reduce interconnect capacitance, dielectric materials with lower values of permittivity have been explored. The expression "low-k" material has evolved to characterize materials with a dielectric constant less than about 3.9.

One type of low-k material that has been explored are a group of flowable oxides which are basically ceramic polymers, such as hydrogen silsesquioxane (HSQ). HSQ-type flowable oxides have been considered for gap filling between metal lines because of their flowability and ability to fill small openings. HSQ-type flowable oxides have been found to vulnerable to degradation during various fabrication steps, including plasma etching.

HSQ typically contains between about 70% and 90% Si—H bonds. However, upon exposure to an $O_2$-containing plasma, a considerable number of Si—H bonds are broken and Si—OH bonds are formed. Upon treatment with an $O_2$-containing plasma, as much as about 20% to about 30% of the Si—H bonds in the deposited HSQ film remained. In addition, it was found that exposure to an $O_2$-containing plasma increased the moisture content of the as deposited HSQ film and its propensity to absorb moisture. An HSQ film having a high Si—OH bond content tends to absorb moisture from the ambient, which moisture outgases during subsequent barrier metal deposition. Thus, it was found that during subsequent barrier and metal deposition. e.g. titanium-nitride and tungsten, outgassing occurred thereby creating voids leading to incomplete electrical connections.

Spin-on-glass (SOG) is also being used to obtain low-k dielectric layers, which can be fabricated at low temperatures. Silicates ($Si(OH)_4$), siloxanes ($(RO)_nSi(OH)_{4-n}$) and silsesquioxanes ($(HSiO_{1.5})_n$) are widely used for SOG materials. Silicates and siloxanes are generally mixed with an alcohol-based solvent such as methanol, ethanol, propanol, butanol, pentanol, hexanol, methylcellosolve, butylcellosolve, propylene glycol, diethylene glycol, or carbinol.

An SOG layer is generally formed on the semiconductor substrate by coating the SOG material mixed with one or more of the above-described solvents on a semiconductor substrate, and then rotating the substrate to uniformly distribute the material. The SOG material in a liquid state can fill grooves or trenches in the substrate to thereby planarize the substrate.

The solvent is generally evaporated by baking. The evaporated solvent and a carbon component generated from the solvent are generally degassed at approximately 100° C. to 400° C. The SOG layer is then thermally cured at temperatures of 400° C. or higher. In particular, the silicate or siloxane material is heated so that silanol (Si—OH) groups in the materials can produce $H_2O$ and cross-link to form a Si—O—Si network, thereby resulting in a solid SOG layer with properties similar to those of conventional $SiO_2$ layers. As a result of the heat treatment, the SOG layer undergoes a change in its index of refraction.

When the siloxane or silicate material is heated, water is generally produced. Accordingly, the volume of the SOG layer is generally reduced during the curing process. Also, the siloxane SOG generally includes some alkyl groups at the position of the silanol group, so that the area of cross-linking may be reduced, to thereby cause less volume reduction. Further, the heat treating process may generate stress in the SOG layer and thereby cause cracks therein. Siloxane SOG may have good crack resistance when it is thickly coated. Silicate SOG is generally more rigid and may create cracks during heat treatment, even when thickly coated.

The SOG heat treating process generally uses a furnace, oven, or hot plate. For example, the semiconductor substrate is heat treated at a temperature below 350° C. on a hot plate, and is then heat-treated above 400° C. in a furnace. However, thermally curing the dielectric film increases thermal stresses in the dielectric film and can damage the semiconductor device. Electrical contacts, such as NiSi contacts, which are sensitive to high temperatures, are susceptible to damage during dielectric thermal curing.

SOG layers may also be hygroscopic. When moisture is absorbed due to hygroscopicity, the cross-linking may be destroyed and thereby adversely impact the properties of the SOG layer. In particular, as the hygroscopicity increases, the dielectric property of the SOG insulating layer may decrease. Accordingly, it is desirable to reduce or eliminate the problems with cracking and hygroscopicity in SOG layers.

Additional problems may be created when SOG is used. A poison via phenomenon may take place wherein the SOG material, which is exposed on the via sidewall, may cause an increase in the contact resistance. In particular, the poison via phenomenon can occur due to outgassing of the SOG. It is known that the poison via phenomenon may be caused by the silanol group in the SOG material. For example, when an Al layer is deposited on the Si—OH group, an oxide layer of $Al_2O_3$ may be formed, which thereby increases the contact resistance.

Another approach has been to employ nanoporous silica, which can have dielectric constants for bulk samples in the range of 1 to 3. Nanoporous silica is attractive because it employs similar precursors as used for SOG and CVD $SiO_2$ and because of the ability to carefully control pore size and pore size distribution. In addition to having a low dielectric constant, nanoporous silica offers other advantages for microelectronics including thermal stability up to at least 500° C., small pore size, the ability to tune the dielectric constant over a wide range, and deposition using similar tools as employed for conventional SOG processing. Density is the key nanoporous silica parameter controlling property of importance for dielectrics. Properties of nanoporous silica may be varied over a continuous spectrum from the extremes of an air gap at a porosity of 100% to dense silica with a porosity of 0%. As density increases, dielectric constant and mechanical strength increase but the pore volume decreases. Density is dependent on pore volume or porosity for given material. The optimal porous material should be compromise between mechanical strength and dielectric constant.

Nanoporous dielectric silica coatings can be formed by depositing a mixture of liquid alkoxysilane precursor composition in a solvent onto a spinning silicon wafer substrate to thereby coat the substrate. The coating is typically polymerized, condensed, and cured to form a nanoporous dielectric silica coating on the substrate. Nanoporous films can also be deposited using CVD methods. One example is a CVD SiCOH film in which the SiCOH precursor is mixed with a porogen chemical. The porogen is incorporated into the CVD film, and it can be removed later using thermal, e-beam, UV, or microwave curing.

SiCOH, which exhibits a dielectric constant of about 2.4 to about 3.1, contains carbon in the amount of about 5 to about 20 atomic %, silicon in the amount of about 15 to about 25 atomic %, oxygen in the amount of about 25 to about 35 atomic %, and hydrogen in the amount of about 35 to about 45 atomic %. SiCOH contains SiC, SiH, CH, and SiOH bonding.

Nanoporous silica films are principally composed of silicon and oxygen in which there are pores distributed throughout the material. The pores range in size from about 0.1 nm to 100 nm. Nanoporous silica films can be used provided that silanol groups and water are excluded from the film. Silanols and water will raise the dielectric constant of the film because they are highly polarizable in an electric field. To make nanoporous film substantially free of silanols and water, an organic reagent such as hexamethyldisilazane or methyltriacetoxysilane, is optionally introduced into the pores of the film. This reagent reacts with silanols on the pore surfaces to form trimethylsilyl groups. The latter serve to mask the silanol groups and to make the film hydrophobic. A drawback to the use of trimethylsilyl group is that the film is no longer pure $SiO_2$. Carbon and hydrogen content may be as high as 10% by weight.

Oxidizing plasmas will readily oxidize trimethylsilyl groups from nanoporous films and this will lead to the formation of water and silanols. In addition, oxidized silica films will easily absorb water from conductive manufacturing environments. The retention of water and silanols as a result of oxidation and or absorption of water from manufacturing environments causes two problems: a significant increase in dielectric constant and difficulty in forming low resistance metal vias (the poison via problem).

Alternative methods of curing have been proposed for curing low-k dielectric film such as electron beam and ultraviolet irradiation. However, electron beam irradiation causes damage to transistors and ultraviolet curing does not increase the mechanical strength as much as electron beam, thus thermal curing may still be required to obtain acceptable mechanical properties.

Porosity and pore size of the dielectric film can be controlled by the adding porogens to the nanoporous and other low-k dielectric films. Porogens are organic compounds that are thermally volatilized during the curing process to create pores in the dielectric film. The porogen undergoes phase separation during the thermal cure of a dielectric/porogen mixture. The phase separated porogen collects in nanoscopic domains within the host material and thermally decomposes into volatile by-products (i.e.—porogen fragments) that diffuse out of the low-k dielectric leaving pores in their place. Dow Chemical's porous SiLK™ product and JSR Corporation's JSR 5109 product are examples of commercially available low-k dielectric precursors containing porogens.

Thus, it would be desirable to produce a nanoporous silica film which has a dielectric constant $\leq 2.5$, which contains low levels of water and which is stable to oxygen plasma as well to other chemical solvents used in semiconductor manufacturing. It would further be desirable to more efficiently form stronger dielectric films with controlled pore sizes and with improved adhesion of the dielectric film to adjoining layers of the semiconductor device.

SUMMARY OF THE INVENTION

There exists a need for methodology enabling the use of low-k dielectric materials as an ILD in high-density, multi-level interconnection patterns. There exist a particular need for methodology enabling the use of low-k dielectrics that provide a surface for strong adhesion of overlying layers. There further exists a need for low-k dielectrics with hydrophobic surfaces to prevent the poison via phenomenon. In addition, there exists a particular need for a method of curing low-k dielectrics without exposing the semiconductor device to an excessive thermal load. Furthermore, there exists a need in this art for a dielectric film with a tightly controlled pore size and pore size distribution.

These and other needs are met by embodiments of the present invention, which provide a method of forming a semiconductor device comprising the steps of depositing a dielectric film on a semiconductor substrate. The dielectric film is exposed to microwave radiation to cure the dielectric film.

The earlier stated needs are further met by embodiments of the present invention, which provide a method of forming a damascene structure on a semiconductor substrate comprising the steps of depositing a first dielectric film on a semiconductor substrate. The first dielectric film is exposed to microwave radiation to cure the first dielectric film. The first dielectric film is patterned to form an opening exposing a portion of the semiconductor substrate and a metal is deposited in the opening.

This invention addresses the needs for an improved method of forming semiconductor devices with low-k inter-layer dielectrics for use in high-density, multi-level interconnection patterns. The adhesion of overlying layers on the ILD, such as barrier layers and etch-stop layers, is improved by the present invention. Also, an ILD is provided with densified surfaces that are not prone to degradation during etching and $O_2$ ashing processes. The protection of the dielectric film surfaces inhibits the formation of silanol bonds during etching and ashing and thus prevents the poisoned via phenomenon. The present invention also provides a stronger inter-layer dielectric film with reduced thermal stress more efficiently formed than thermally cured inter-layer dielectric films. The present invention further provides a high reliability semiconductor device without subjecting the semiconductor to damaging thermal loads during processing.

The foregoing and other features, aspects, and advantages of the present invention will become apparent in the following detailed description of the present invention when taken in conjunction with the accompanying drawings.

DETAILED DESCRIPTION OF THE INVENTION

The present invention enables the production of semiconductor devices with improved performance and reduced feature sizes by exposing dielectric films to microwave radiation to cure the dielectric films. The microwave cured dielectric films provide a dielectric film surface which allows stronger adhesion of overlying layers, including barrier layers, etch-stop layers, and additional dielectric films. The microwave curing densifies the surface of the dielectric films, and makes the surface of the dielectric film more $SiO_2$-like by causing silanol groups to crosslink at the dielectric surface. The lack of silanol bonds prevents the uptake of water and the resulting poisoned via phenomenon.

The term semiconductor devices, as used herein, is not to be limited to the specifically disclosed embodiments. Semiconductor devices, as used herein, include a wide variety of electronic devices including flip chips, flip chip package assemblies, transistors, capacitors, microprocessors, random access memories, bipolar devices, and light emitting diode devices, etc. In general, semiconductor devices refer to any electrical device comprising semiconductors.

Figure 1:
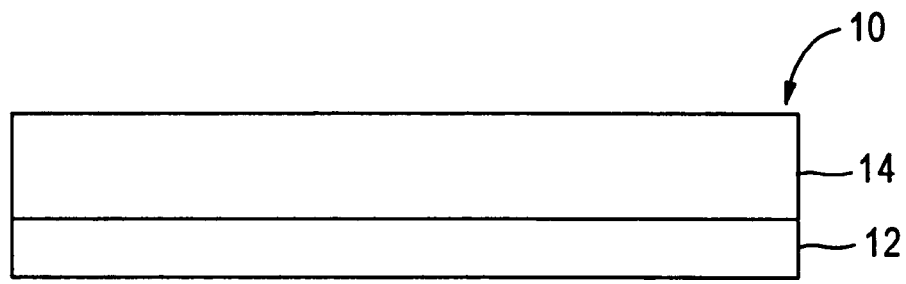
FIG. 1 illustrates a semiconductor device with a first dielectric film formed thereon.

As shown in FIG. 1, a dielectric film 14 is deposited on a semiconductor substrate 12. In certain embodiments of the present invention, the dielectric material in the dielectric film 14 is spun-onto the semiconductor substrate 12. The dielectric material is carried in a suitable high volatility solvent and is typically applied to the semiconductor substrate surface under ambient conditions. Other techniques of depositing the dielectric film may also be used in certain other embodiments of the present invention, including CVD techniques.

The dielectric film may comprise a silsesquioxane polymer, a siloxane polymer, a carbon-doped glass (organosilicate glass), a polyarylene ether, a fluorinated polyarylene ether, nanoporous silica, polymeric dielectric materials or mixtures thereof. Polymeric dielectric materials useful for the invention include hydrogensiloxanes, which have the formula $[(HSiO_{1.5})_xO_y]_n$, hydrogensilsesquioxanes which have the formula $(HSiO_{1.5})_n$, methylsilsesquioxane, and hydroorganosiloxanes which have the formulae $[(HSiO_{1.5})_xO_y (RSiO_{1.5})_z]_n$ and $[(HSiO_{1.5})_x(RSiO_{1.5})_y]_n$. In each of these polymer formulae, x=about 6 to about 20, y=1 to about 3, z=about 6 to about 20, and n=1 to about 4,000, and each R is independently H, $C_1$ to $C_8$ alkyl, or $C_6$ to $C_{12}$ aryl. The weight average molecular weight may range from about 1,000 to about 220,000. In certain embodiments n ranges from about 100 to about 800 yielding a weight average molecular weight of about 5,000 to about 45,000. In other certain embodiments, n ranges from about 250 to 650 yielding a weight average molecular weight of from about 14,000 to about 36,000. Useful polymers include hydrogensiloxane, hydrogensilsesquioxane, hydrogenmethylsiloxane, hydrogenethylsiloxane, hydrogenpropylsiloxane, hydrogenbutylsiloxane, hydrogen-tert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane, and mixtures thereof. Hydroorganosiloxanes, polyarylene ethers, fluorinated polyarylene ethers, and mixtures thereof are particularly useful. Useful organic polymers include polyimides, fluorinated and nonfluorinated poly(arylethers) available under the trade name FLARE™ from AlliedSignal Inc., and copolymer mixtures thereof. Other suitable organic polymers include those available under the trade name SiLK™ from Dow Chemical. Preferred siloxane materials suitable for use in this invention are commercially available from AlliedSignal. Inc. under the trade name Accuglass®. The polymer component is preferably present in the amount of from 10% to about 30% by weight of the composition. In certain embodiments the polymer component is present in the ranges of from about 15% to about 30% by weight of the composition and in other embodiments the polymer component ranges from about 17% to about 25% by weight of the composition. CVD deposited films include Black Diamond from Applied Materials, Coral from Novellus, or Aurora from ASM.

The dielectric material composition contains a suitable solvent component comprising at least one solvent. Suitable solvents are present in an amount to form a uniform solution or dispersion of the dielectric material. Examples of useful linear solvents include decamethyltetrasiloxane, 1,3-dioctyltetramethyldisiloxane, octamethyltrisiloxane, pentamethyldisiloxane, hexamethyldisiloxane, 1,1,3,3,5,5-hexamethyltrisiloxane, 1,1,3,3-tetramethyldisiloxane, 1,3-bis-(trimethylsiloxy)-1,3-dimethylsiloxane, bis-(trimethylsiloxy)ethylsilane, bis(trimethylsiloxy)methylsilane, decamethyltetrasiloxane, dodecamethylpentasiloxane, 1,1,1,3,3,5,5-heptamethyltrisiloxane, hexaethyldisiloxane, heptamethyltrisiloxane, and 1,1,3,3-tetraisopropyldisiloxane.

Examples of useful cyclic solvents nonexclusively include decamethylcyclopentasiloxane, hexaethylcyclotrisiloxane, hexamethylcyclotrisiloxane, 1,3,5,7-tetramethylcyclotetrasiloxane, pentamethylcyclopentasiloxane, octamethylcyclotetrasiloxane, methylhydrocyclosiloxanes of the formula $(CH_3HSiO)_{3-5}$, 1,3,5,7-tetraethylcyclotetrasiloxane and 1,3,5,7-tetramethylcyclotetrasiloxane. Blends of the solvents of this invention are particularly suitable since by forming such blends one is able to fine-tune the evaporation rate of the composition on a substrate. The solvent component is present in the overall composition in an amount of from about 70% to about 90% by weight of the composition. In certain embodiments the solvent is present in an amount of from about 70% to about 85% and in other embodiments from about 75% to about 83% by weight of the composition.

The dielectric material is applied to the substrates via conventional chemical vapor deposition (CVD), spin-coating, dip coating, spraying, or meniscus-coating methods that are well known in the art. In the case of spin-coating, the thickness of the dielectric film formed on the substrate may vary depending on the amount of liquid dielectric that is applied to the substrate, but typically the thickness may range from about 500 Å to about 50,000 Å, and in certain embodiments from about 2000 Å to about 12,000 Å. Liquid dielectric material is typically spun onto the upper surface of the substrate according to known spin techniques. The liquid dielectric material is typically applied from a solution which is centrally applied to the substrate and then spun on a rotating wheel at speeds ranging between about 500 rpm and about 6000 rpm, preferably from about 1500 rpm to about 4000 rpm, for about 5 seconds to about 60 seconds, preferably from about 10 seconds to about 30 seconds, in order to spread the solution evenly across the substrate surface. In the case of CVD, the thickness depends on the deposition time, plasma conditions, and chemistry. The dielectric material typically has a density of from about 1 $g/cm^3$ to about 3 $g/cm^3$.

After the dielectric material is applied to the substrate, the dielectric is exposed to microwave radiation for a time sufficient to evaporate solvents present within the dielectric film and cure the film. The microwave exposure parameters are dependent on the materials and the coating methods. Generally, the dielectric coated substrate is exposed to microwave radiation for about 30 seconds to about 60 minutes. In certain embodiments of the present invention, the dielectric film is exposed to microwave radiation for less than 60 minutes. In certain other embodiments of the present invention, the dielectric film is exposed to microwave radiation for less than about 20 minutes. This is preferably done in a microwave chamber with a controlled environment. In certain other embodiments the film may be externally heated with simultaneous microwave exposure to further heat the film rapidly.

The use of microwave radiation to cure the dielectric film enables lower curing temperatures and increases the strength of low-k dielectric films. Microwaves can couple to dipoles such as silanol (Si—OH) groups and cause localized heating. Microwave curing can drive Si—OH condensation reactions, resulting in a greater degree of crosslinking and increased mechanical strength. Because the heating is localized, the time required for thermal transport in heated ovens and furnaces is avoided, thus drastically reducing the cure time and temperature. The time required for curing the low-k dielectric films can be reduced from an hour or more to less than about 20 minutes.

The use of microwave radiation causes rapid, localized heating of the portion of the dielectric film absorbing the microwaves. Therefore, the affected areas of the dielectric film rapidly reach the required temperature for crosslinking. Because the microwave heating is localized, the microwave cured dielectric films may be able to withstand higher temperatures at the crosslinking sites than thermally cured dielectric films without damaging thermally sensitive semiconductor components.

In certain embodiments of the present invention, the microwave radiation exposure is performed until there is a reduction of about 0.1 to about 0.4 in the index of refraction of the dielectric material. In certain other embodiments, the index of refraction is reduced by about 0.2 to about 0.3.

Figure 2:
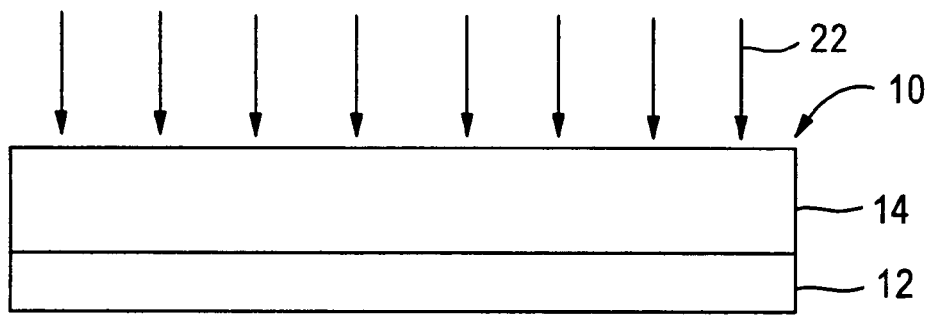
FIG. 2 illustrates exposing a first dielectric film to microwave radiation.

As shown in FIG. 1, a dielectric film 14 is formed on a semiconductor substrate 12. In certain embodiments of the present invention, the semiconductor substrate comprises a semiconductor device, such as a transistor. In certain embodiments of the present invention, transistors comprise contacts that are thermally sensitive, such as NiSi contacts. As shown in FIG. 2, the dielectric film 14 is exposed to microwave radiation 22 to cure the dielectric film 14. The microwave radiation exposure is performed in a microwave chamber at a frequency in the range of about 5 MHz to about 3000 MHz for 200 mm wafers and will scale with larger wafers to generate the appropriate power density. In certain embodiments of the present invention, the microwave radiation exposure is performed at a particular frequency. Specific microwave radiation exposure frequencies included in certain embodiments of the present invention are: 13.56 MHz, 27.12 MHz, 896 MHz, and 2450 MHz. The dielectric film 14 is exposed to microwave radiation at a power of from about 100 W to about 3000 W. In certain embodiments of the present invention, the dielectric film 14 is exposed to microwave radiation at a power of from about 500 W to about 1500 W.

Figure 3:
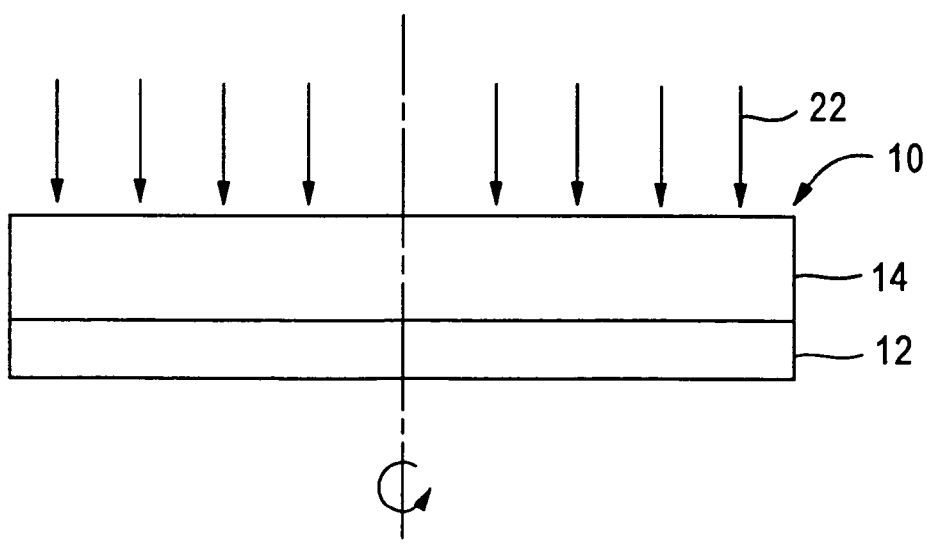
FIG. 3 illustrates a semiconductor device with a first dielectric film being exposed to microwave radiation according to another embodiment of the invention.

In certain embodiments of the present invention, the dielectric film 14/semiconductor substrate 12 combination is rotated while being exposed to microwave radiation 22, as shown in FIG. 3, to ensure even exposure of the dielectric film 14.

Figure 4:
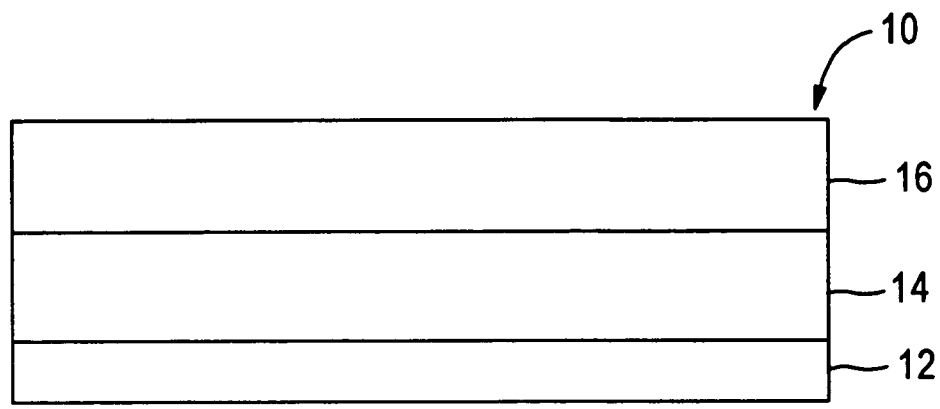
FIG. 4 illustrates a resist film formed on a first dielectric film.
Figure 5:
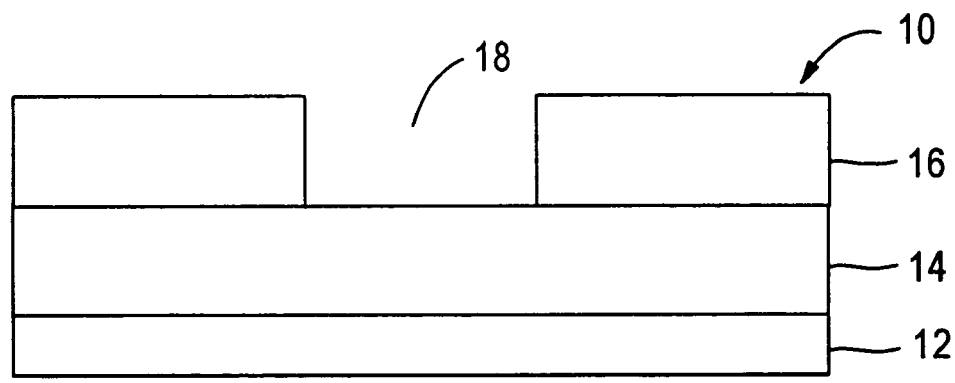
FIG. 5 illustrates a semiconductor substrate with an overlying first dielectric film and a patterned resist film.
Figure 6:
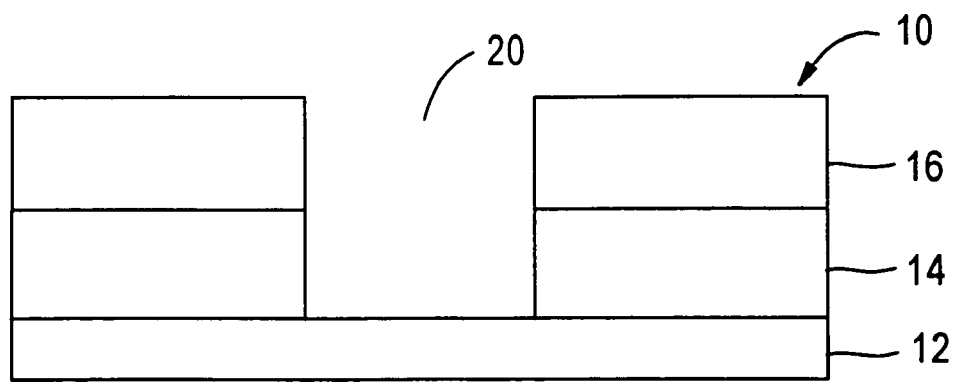
FIG. 6 illustrates the transference of a pattern in a resist film into an underlying first dielectric film.

A resist layer 16, such as a photoresist, is formed on the dielectric film 14, as shown in FIG. 4. The resist layer 16 is patterned according to conventional photolithographic processing, as shown in FIG. 5, i.e., a photoresist is spin coated on the dielectric film 14, selectively exposed to actinic radiation, and developed, to form opening 18. The pattern in the resist layer 16 is subsequently transferred to the dielectric film 14 using a conventional anisotropic etch to form an opening 20, as shown in FIG. 6.

The resist layer 16 is subsequently stripped from the patterned dielectric film 14. The resist layer is removed by conventional methods, such as stripping with chemical solvents, or removal by $O_2$ plasma ashing.

Figure 7:
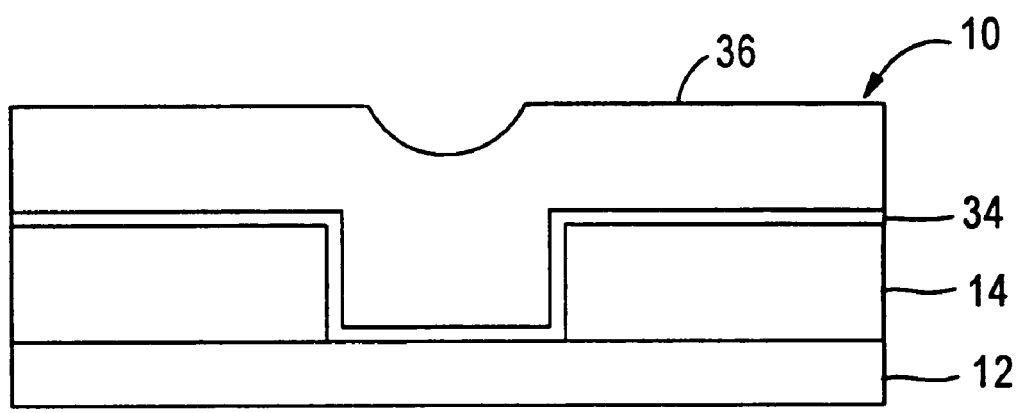
FIG. 7 illustrates a semiconductor device with a patterned dielectric layer filled with metal.

After patterning the dielectric film 14, additional layers and materials can be deposited on the dielectric film 14. As shown in FIG. 7, metal layer 36 is deposited in opening 20 and over dielectric film 14. In certain embodiments of the present invention, metals deposited to form an interconnect include copper and aluminum. If copper is used, a barrier layer 34 is first deposited. The microwave cured dielectric 14 provides strong adhesion to the barrier layer 34. Typical barrier layers for preventing Cu diffusion include Ta, TaN, Ti, TiN, TiSiN, TaSiN, and WN, and combinations of two or more such materials. In certain embodiments of the present invention, the barrier layer 34 is deposited by physical vapor deposition (PVD), plasma enhanced chemical vapor deposition (PECVD) deposition, chemical vapor deposition (CVD), or atomic layer deposition (ALD) to a thickness of about 300 Å.

Figure 8:
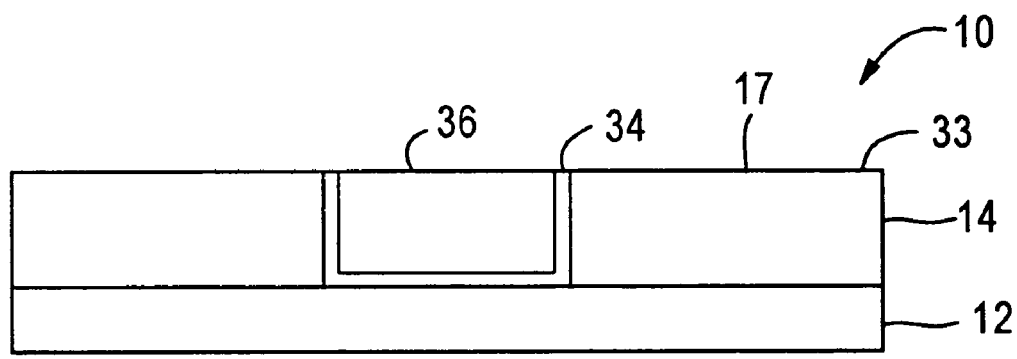
FIG. 8 illustrates a planarized semiconductor device with a dielectric film filled with metal.

After forming barrier layer 34, a copper seed layer (not shown) is deposited to overlay the barrier layer 34. The copper seed layer provides electroplating initiation sites for the subsequent formation of a copper layer. Preferably, the copper seed layer is formed by PVD or PECVD of copper to a thickness of about 2,000 Å. After deposition of the copper seed layer, opening 20 is filled with copper 36 by either an electroless or electroplating process. After forming metal layer 36, a planarization process is carried out to form in-laid copper leads 36, as shown in FIG. 8. A non-selective planarization process, such as chemical-mechanical polishing (CMP), is used to form planar surface 33. Alternatively, a non-selective plasma etching process can also be used. The non-selective planarization process removes substantially all layers overlying upper surface 17 of dielectric film 14. The microwave cured surface layer 17, further acts as an etch-stop or polishing stop during the planarization process. Depending upon the polishing resistance or etching resistance (the level of microwave curing) a surface portion 17 of dielectric film 14 may also be removed during the planarization process. Once completed, in-laid copper leads 36 are defined by the shape of the opening 20. In-laid copper leads 36 can extend in a variety of directions over the surface of the semiconductor substrate 12 in order to electrically interconnect various circuit components commonly used in an integrated circuit device.

Figure 9:
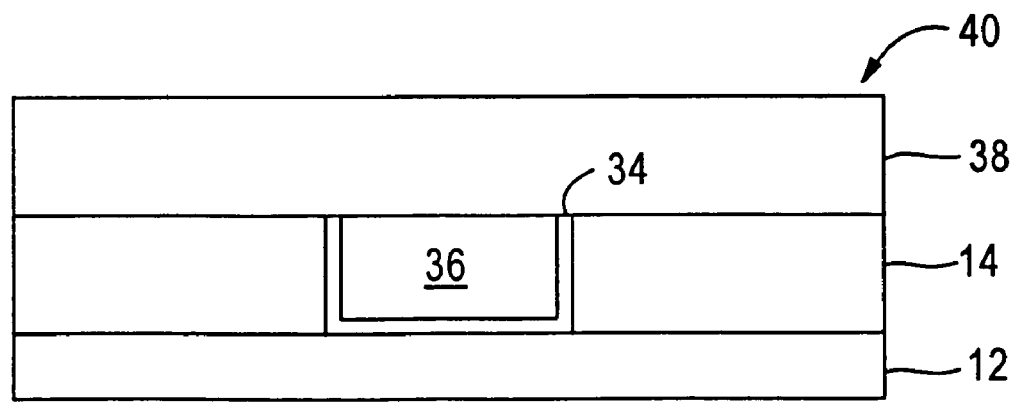
FIG. 9 illustrates a second dielectric film formed on a metal filled patterned first dielectric film.
Figure 10:
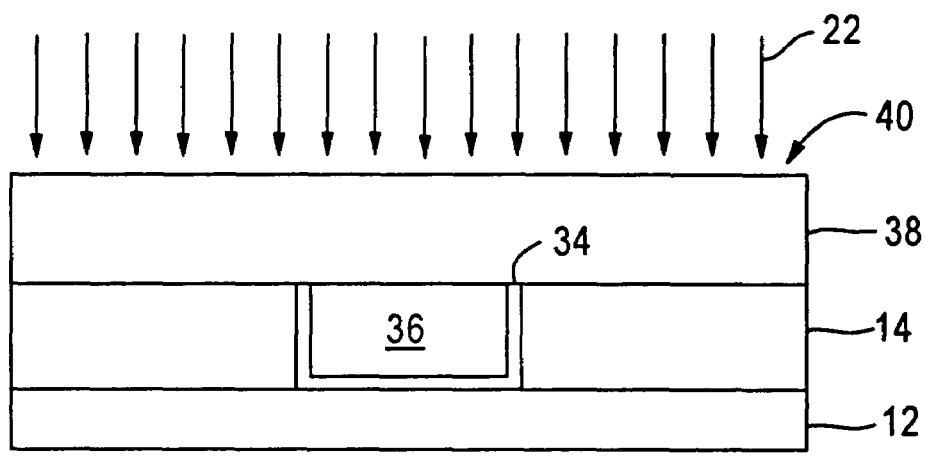
FIG. 10 illustrates exposing a second dielectric film to microwave radiation.
Figure 11:
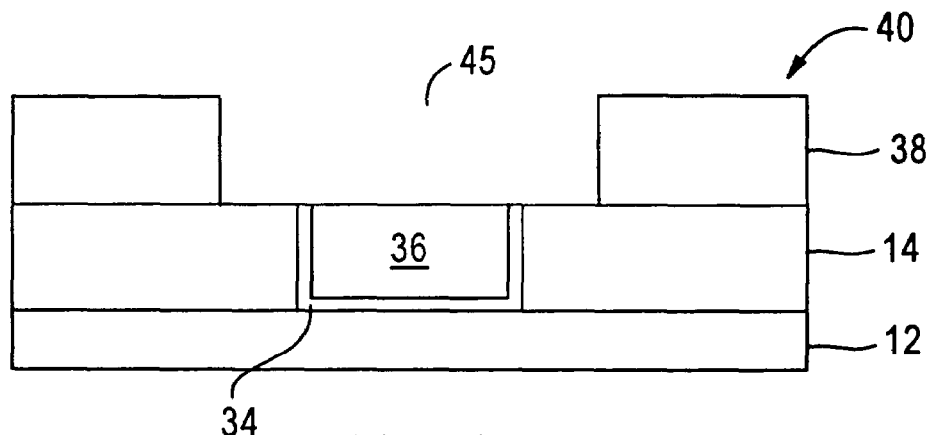
FIG. 11 illustrates a trench formed in the second dielectric layer.

This invention may also be used to form multi-level interconnects. As shown in FIG. 9, a second dielectric film 38 is deposited on the first in-laid dielectric film 14. The second dielectric film 38 is then cured by exposing the second dielectric film 38 to microwave radiation 22 as shown in FIG. 10. The cured dielectric film 38 is patterned using conventional photolithographic techniques to form opening 45, as shown in FIG. 11.

Figure 12:
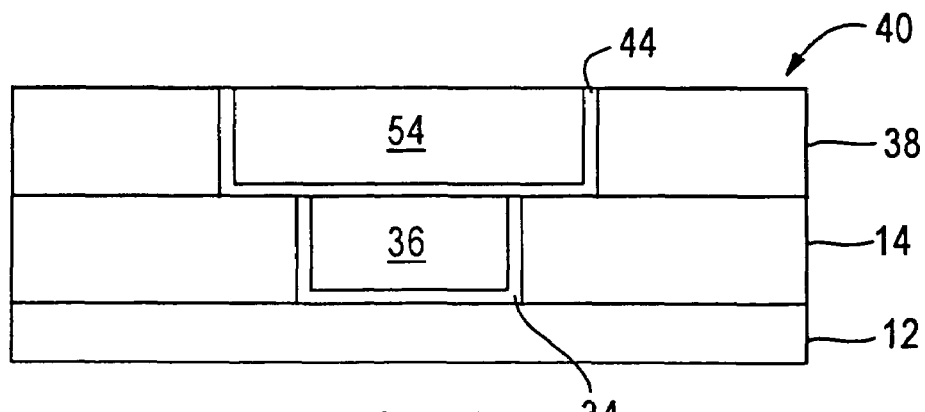
FIG. 12 illustrates a planarized semiconductor device with a barrier layer and a metal filled patterned second dielectric layer.

Prior to depositing a Cu layer, a barrier layer 44 is deposited in opening 45. A barrier layer 44 is formed according to the process previously described herein. Subsequent to the formation of barrier layer 44, opening 45 is filled with a Cu or Cu alloy, using plating techniques previously described herein. Semiconductor device 40 is planarized using methods previously described herein to form the second in-laid metal interconnect 54, as shown in FIG. 12.

Figure 13:
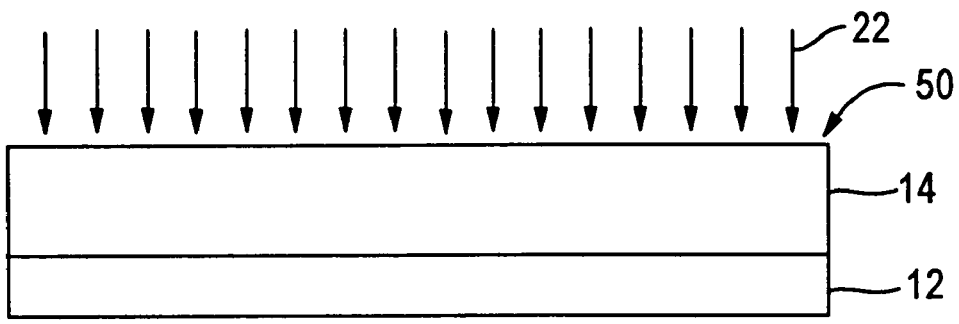
FIG. 13 illustrates a semiconductor device with a first dielectric film exposed to microwave radiation.
Figure 14:
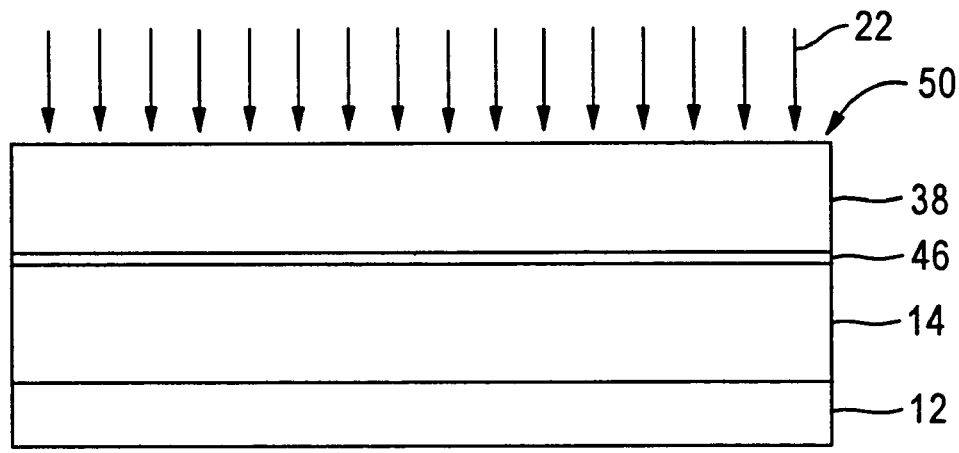
FIG. 14 illustrates a semiconductor device with first and second dielectric layers formed thereon and a second dielectric layer exposed to microwave radiation.
Figure 15:
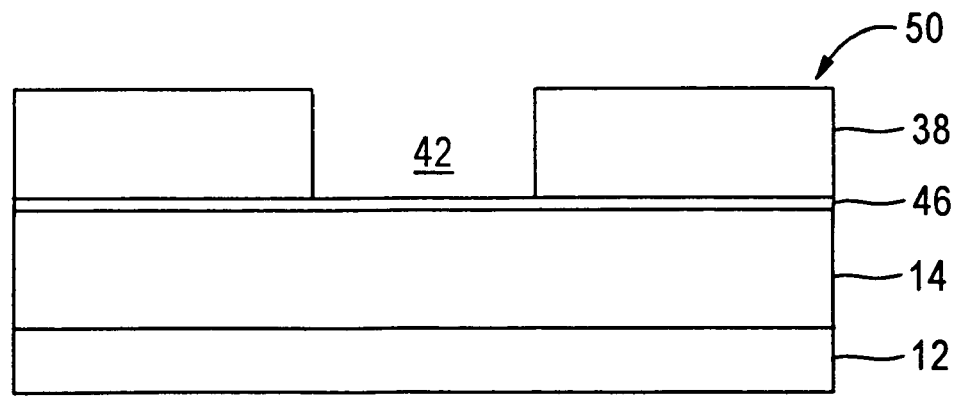
FIG. 15 illustrates an opening formed in a second dielectric layer.
Figure 16:
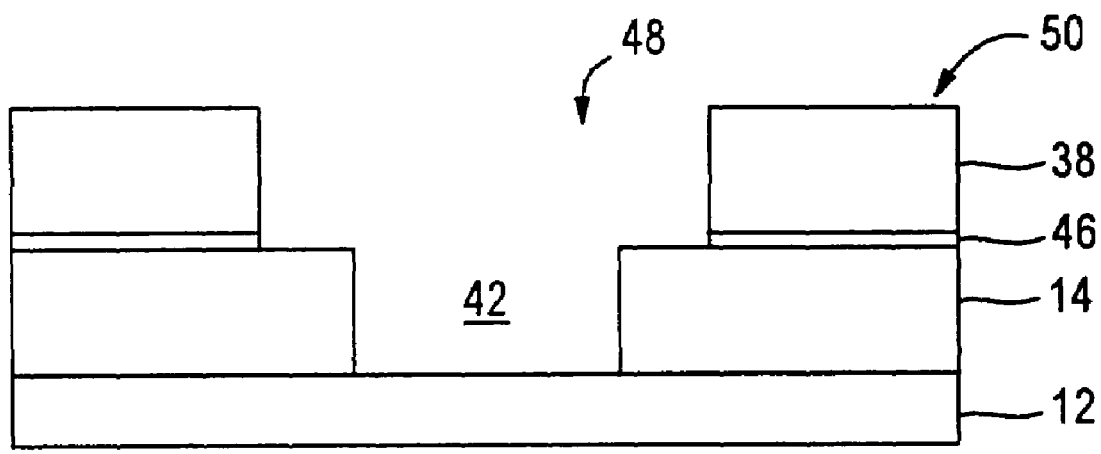
FIG. 16 illustrates a semiconductor device with a trench/via structure formed thereon.
Figure 17:
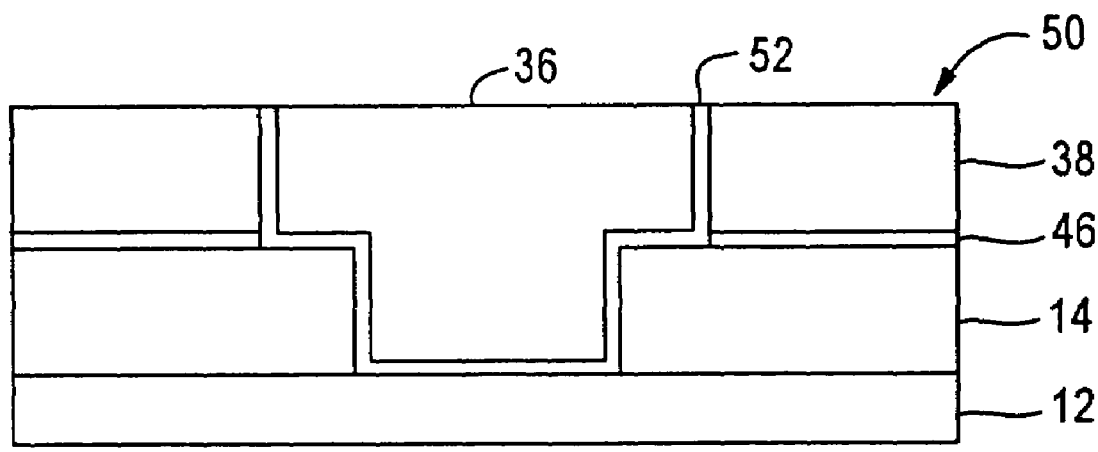
FIG. 17 illustrates a dual damascene interconnect formed on a semiconductor device.

An alternative method of forming multi-level interconnect structures by a dual damascene technique is now described. First a dielectric film 14 is deposited on a semiconductor substrate 12, as shown in FIG. 13, and exposed to microwave radiation 22 to cure the dielectric film 14. The microwave cured dielectric film 14 provides strong adhesion to a subsequently deposited intervening layer 46. Intervening layer 46 can be an etch stop material or an antireflective composition (ARC) layer. A second dielectric film 38 is deposited over the intervening layer 46 and exposed to microwave radiation 22 to cure the second dielectric film 38, as shown in FIG. 14. Alternatively, both film 14 and film 38 may be cured simultaneously after all the films have been deposited. The second dielectric film 38 is subsequently patterned using conventional photolithographic and etching techniques, as shown in FIG. 15, to form via 42. The semiconductor device 50 subsequently undergoes further photolithographic patterning and etching, as seen in FIG. 16, to form a trench 48 in second dielectric film 38 around the via 42 and to extend the via 42 through first dielectric film 14, exposing a portion of semiconductor substrate 12. During the formation of the via 42 and the trench 48 in the second dielectric film 38, the intervening layer 46 functions as an etch stop. Subsequent to the formation of the trench/via structure 48, 42 in the first and second dielectric films 14, 38, barrier layer 52 is deposited in the trench/via structure 48, 42 if the metal 36 to be deposited is Cu or Cu alloy. The metal 36 is deposited in the trench/via 48, 42, according to previously described processes. As previously described herein, after metal deposition, the structure 50, is planarized according to conventional techniques, e.g., CMP, forming a semiconductor device 50 with a dual damascene interconnect structure, as shown in FIG. 17.

The present invention allows the formation of low-k dielectric films that promote strong adhesion of subsequently deposited films such as ARC, capping layers, etch stop materials, barrier films, and additional dielectric films with a reduced thermal budget. The microwave exposure cures the low-k dielectric film by causing SiOH to crosslink on the surface to form a silicon oxide surface. Overlying layers, such as barrier layers, and metals more strongly adhere to a silicon oxide surface than a non-crosslinked surface. The present invention is particularly well-suited for forming Cu in-laid dual damascene interconnects. By providing strong adhesion of barrier layers and additional dielectric layers, Cu diffusion, along with subsequent short circuiting, is prevented.

In certain embodiments of the present invention, the low-k dielectric films do not readily absorb microwaves. Certain low-k dielectric materials, such as uncured CVD organosilicate glass (OSG) films may not have enough defect sites or silanols to effectively couple with microwaves. This shortcoming, however, can be overcome by incorporating residual moisture or porogens that readily absorb microwaves in the dielectric film composition. Many uncured low-k dielectric films contain residual moisture, solvents, and silanols which absorb microwave radiation. The incorporation of additional moisture or porogens will assist the microwave absorption and facilitate microwave heating and subsequent curing of a low-k dielectric film that does not readily absorb microwaves.

In certain embodiments of the present invention, the microwave curing can be used in conjunction with electron beam or ultraviolet irradiation. For example, ultraviolet irradiation of an OSG film containing porogens can decompose the porogen, but the decomposed porogen remains in the dielectric film. Thus, thermal annealing is still needed for ultraviolet cured films. Microwave heating, however, can be used to diffuse the decomposed porogen. Microwave curing coupled with ultraviolet curing may allow porogen diffusion with a lower thermal budget than thermal curing, especially if the porogen decomposition products absorb microwaves. The use of a specific porogen could allow "tuning" of the porogen/dielectric mixture to provide selected curing temperatures and times. In addition, transient film stress generated by porogen expansion during microwave curing could drive further crosslinking reactions and thus increase the mechanical strength of the cured dielectric film.

In certain embodiments of the present invention, suitable microwave absorbing materials include those that have intermediate loss tangent values. Materials with low loss tangent values will be transparent to microwave radiation, while materials with high loss tangent values (e.g.—bulk metals) are opaque and will reflect microwaves. Materials with intermediate loss tangent values readily absorb microwaves, and an inverse heating gradient results, so that the core of the dielectric film heats up quicker than the surface.

The embodiments illustrated herein are for illustrative purposes only. The embodiments illustrated should not be construed to limit the scope of the claims. As is clear to one of ordinary skill in the art, the instant disclosure encompasses a wide variety of embodiments not specifically illustrated herein.

What is claimed is:

1. A method of forming a damascene structure on a semiconductor substrate comprising the sequential steps of:

depositing a first dielectric film on a semiconductor substrate;

depositing a second dielectric film;

simultaneously exposing the first dielectric film and the second dielectric film to microwave radiation to cure the first dielectric film and the second dielectric film;

patterning the second dielectric film to form a trench exposing the first dielectric film;

patterning the first dielectric film to form a via exposing a portion of the semiconductor substrate; and depositing a metal in the via and the trench.

2. The method according to claim 1, wherein the semiconductor substrate is rotated while the dielectric films are being exposed to the microwave radiation.

3. The method according to claim 1, wherein the microwave radiation exposure is performed at a frequency of from about 5 MHz to about 3000 MHz and a power of from about 100 W to about 3000 W.

4. The method according to claim 1, wherein the dielectric films are exposed to the microwave radiation for from about 30 seconds to about one hour.

5. The method according to claim 1, wherein the metal comprises aluminum or copper.

6. The method according to claim 1, wherein an etch stop layer is deposited on the first dielectric film before the deposition of the second dielectric film.

7. The method according to claim 1, wherein the first and second dielectric films comprise low-k dielectric materials.

8. The method according to claim 7, wherein the low-k dielectric materials are selected from the group consisting of hydrogensilsesquioxanes, methylsilsesquioxanes, hydroorganosilsesquioxanes, nanoporous silicas, hydrogen siloxanes, hydroorganosiloxanes, alkoxysiloxanes, polyarylene ethers, fluorinated polyarylene ethers, and polyimides.

9. The method according to claim 7, wherein the metal comprises copper and further comprising forming a barrier layer in the via and trench before depositing the metal.

10. The method according to claim 7, wherein the low-k material further comprises a porogen.

11. The method according to claim 10, wherein the porogen is a volatile organic compound.

12. The method according to claim 5, wherein the metal comprises Cu and further comprising depositing a barrier layer in the opening.

13. The method according to claim 12, wherein the barrier layer is selected from the group consisting of Ta, TaN, Ti, TiN, TiSiN, TaSiN, and WN.

14. A method of forming a damascene structure on a semiconductor substrate comprising the steps of:
    depositing a first dielectric film on a semiconductor substrate;
    depositing a second dielectric film;
    simultaneously exposing the first dielectric film and the second dielectric film to microwave radiation to cure the first dielectric film and the second dielectric film;
    patterning the second dielectric film to form a trench exposing the first dielectric film;
    patterning the first dielectric film to form a via exposing a portion of the semiconductor substrate; and
    depositing a metal in the via and the trench,
    wherein the first and second dielectric films comprise low-k dielectric materials selected from the group consisting of hydrogensilsesquioxanes, methylsilsesquioxanes, hydroorganosilsesquioxanes, nanoporous silicas, hydrogen siloxanes, hydroorganosiloxanes, and alkoxysiloxanes.

15. The method according to claim 14, wherein the semiconductor substrate is rotated while the dielectric films are being exposed to the microwave radiation.

16. The method according to claim 14, wherein the microwave radiation exposure is performed at a frequency of from about 5 MHz to about 3000 MHz and a power of from about 100 W to about 3000 W.

17. The method according to claim 14, wherein the low-k material further comprises a porogen.

18. The method according to claim 14, wherein the metal comprises aluminum or copper.

19. The method according to claim 18, wherein the metal comprises Cu and further comprising depositing a barrier layer in the opening.

20. The method according to claim 19, wherein the barrier layer is selected from the group consisting of Ta, TaN, Ti, TiN, TiSiN, TaSiN, and WN.

* * * * *